Feb. 5, 1957 N. L. JOHANSON 2,780,725

MODULATOR-DEMODULATOR LIMITER TRANSISTOR CIRCUITS

Filed Nov. 21, 1955 2 Sheets-Sheet 1

INVENTOR.
NORMAN L. JOHANSON

BY
Reynolds, Beach & Christensen
ATTORNEYS

MODULATOR-DEMODULATOR LIMITER TRANSISTOR CIRCUITS

Filed Nov. 21, 1955 2 Sheets-Sheet 2

CIRCUIT OPERATION AS DEMODULATOR-LIMITER
(FOR A GIVEN PHASE OF $\bar{E}_i$ )

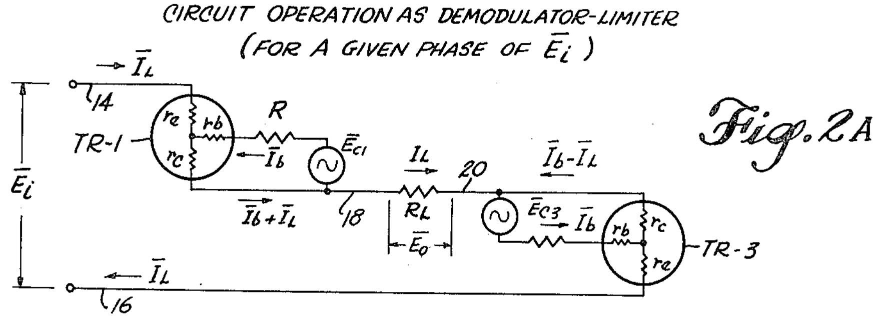
Fig. 2A

EQUIVALENT CIRCUIT DURING ONE HALF CYCLE BEFORE LIMIT

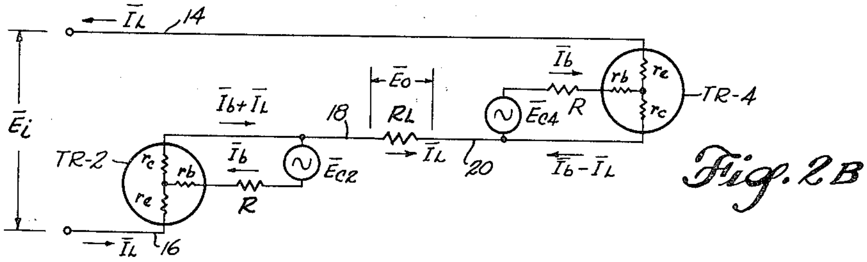
Fig. 2B

EQUIVALENT CIRCUIT DURING OTHER HALF CYCLE BEFORE LIMIT

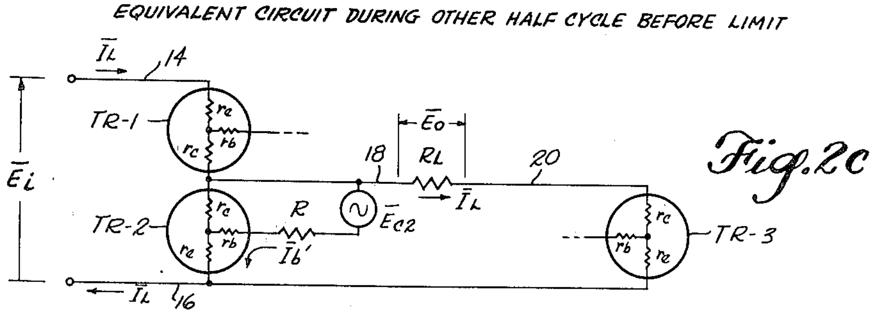
Fig. 2C

EQUIVALENT CIRCUIT IN LIMIT DURING ONE HALF CYCLE
($\bar{E}_{c2}$ DETERMINES LIMIT)

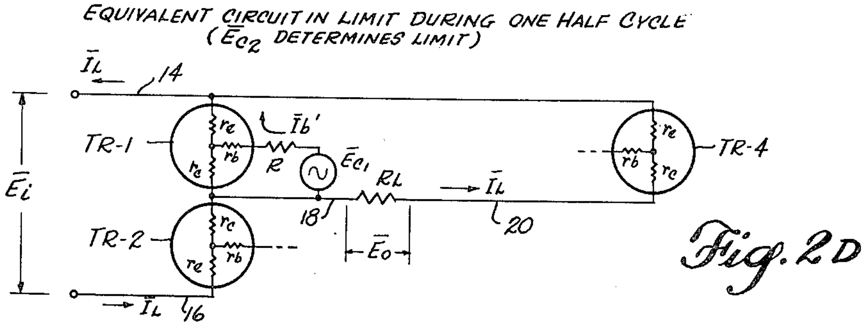
Fig. 2D

EQUIVALENT CIRCUIT IN LIMIT DURING OTHER HALF CYCLE
($\bar{E}_{c1}$ DETERMINES LIMIT)

INVENTOR.
NORMAN L. JOHANSON

BY
Reynolds, Beach & Christensen
ATTORNEYS 2,780,725

MODULATOR-DEMODULATOR LIMITER TRANSISTOR CIRCUITS

Norman L. Johanson, Seattle, Wash., assignor to Boeing Airplane Company, Seattle, Wash., a corporation of Delaware Application November 21, 1955, Serial No. 547,928

7 Claims. (Cl. 250—31)

This invention relates to a new and improved translation circuit using transistors for performing the functions of modulation and demodulation. The novel circuit inherently limits the amplitude of the modulated carrier wave at a predetermined value, or the magnitude of the demodulated signals at a predetermined value. The invention is herein illustratively described by reference to the presently preferred form thereof, however it will be recognized that certain changes and modifications may be made therein without departing from the essential features involved.

A broad object of the invention is a relatively simple, reliable and generally practicable transistor circuit of the phase-sensitive type performing the above-mentioned and other functions as hereinafter described.

Another object is such a circuit which may be operated directly from a single-ended source of modulation signals to be imposed on a carrier wave, or from a single-ended source of modulated carrier wave to be demodulated.

Still another object of the invention is such a circuit wherein the limited output waves, i. e. the modulated carrier waves or the rectified, demodulated carrier waves, have substantially the same wave shape as the original carrier wave or switching voltage regardless of the output value at which the circuit limits.

A further object is such a circuit wherein the output signals of one phase or polarity may be limited at the same value or at a different value from the limit imposed on output signals of the relatively opposite phase or polarity.

An additional object is to provide such a circuit wherein the amplitude or magnitude of the output signals linearly follow changes in amplitude or magnitude of the input signals to the limiting value or values inherent in the particular circuit design; and wherein the limit level or levels established in the circuit are directly proportional to the limit-controlling voltages.

Still other objects include such a circuit which has a high conversion gain or efficiency, good linearity at low signal levels, low power consumption, a minimum number and size of components and low zero-drift.

An incidental object or advantage of the circuit is its symmetrical arrangement by which, in certain cases the input terminals are interchangeable with the output terminals for either the modulation or demodulation functions.

In brief terms, the novel translation circuit arrangement as herein disclosed comprises in combination with a pair of input conductors and output conductors, two pairs of transistors, with the emitter-collector paths of the members of each pair being serially connected with relatively opposite polarity across the input conductors, and with the load conductors respectively connected to the junctions between the individual pairs. Alternating control voltage is applied to a set of control elements of one transistor in each pair and similar alternating control voltage of relatively opposite polarity to a set of control elements of the other transistor in each pair.

For demodulation purposes such control voltage is of the same frequency as the carrier wave in the input signals and is normally cophased therewith. In both the modulation and demodulation functions of the circuit the desired limiting of output voltage may be achieved in respect to either polarity or phase thereof, or to both polarities or phases thereof, by establishing the amplitudes of control voltages applied to one or both pairs of transistors at values less than the amplitude or magnitude of the input signals. The limiting action arising from variable biasing of the transistors, in the case of demodulation the rectified output wave half-cycles correspond substantially in form to the original carrier wave, whereas in the case of modulation the modulated carrier wave in the output has substantially the wave shape of the initial carrier wave.

These and other features, objects and advantages of the invention will become more fully evident from the following description by reference to the accompanying drawings.

Figures 2A through 2D illustrate the equivalent schematic diagrams of the circuit during different portions of its operating cycle as a demodulator-limiter.

Figure 1:
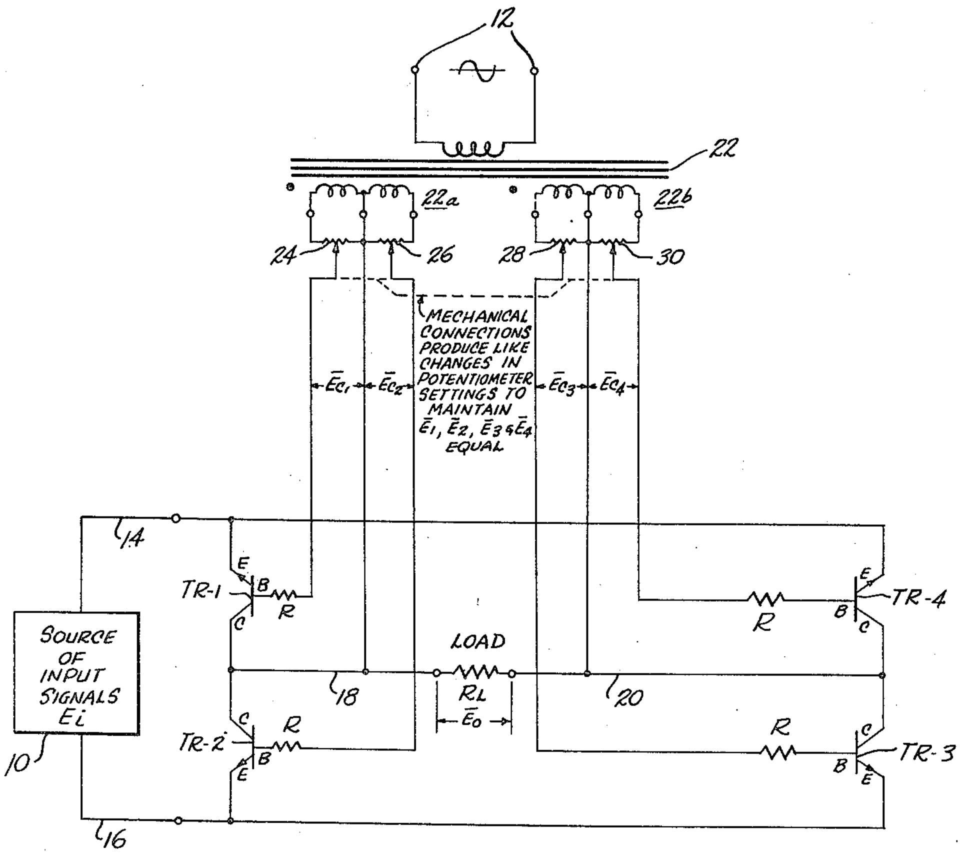
Figure 1 is a schematic diagram of the circuit in its presently preferred form.

Referring to the drawings, the circuit as shown in Figure 1 is generalized so that it may function either as a modulator or as a demodulator. The signal source 10, representing the source of input voltage $\bar{E}_i$, may be a source of either alternating voltage, direct voltage or of direct and alternating voltages to be imposed as modulation on a carrier wave applied at terminals 12. Alternatively the source 10 may represent a source of modulated carrier wave to be demodulated by mixing the same with a demodulating or switching wave of equal frequency applied to terminals 12. The source 10 is connected to input conductors 14 and 16.

In regard to the limiting function of the circuit, to be described more fully hereinafter, the amplitude of the alternating voltage applied to terminals 12 may be constant or variable in order to vary the limits imposed on the output voltage appearing between output conductors 18 and 20, between which a load represented by resistance $R_L$ is connected. In the illustration the alternating voltage is assumed to be of constant amplitude and is applied to the primary of transformer 22. The transformer has two similar center-tapped secondaries 22*a* and 22*b*. The pairs of voltages developed across the respective halves of secondary 22*a* may be applied directly as bias or control voltages for controlling one pair of transistors TR–1 and TR–2 or, as shown, may be applied to the windings of the respective voltage-changing potentiometers 24 and 26 by which the actual transistor control voltages $\bar{E}_{c1}$ and $\bar{E}_{c2}$ may be varied at will for imposing different limit values on one phase of polarity of the output voltage $\bar{E}_o$. Likewise, in the example, the pairs of voltages developed across the respective halves of secondary 22*b* may be applied directly as bias or control voltages for controlling the other pair of transistors TR–3 and TR–4 or, as shown, may be applied to the windings of the respective voltage-changing potentiometers 28 and 30 by which the actual transistor control voltages $\bar{E}_{c3}$ and $\bar{E}_{c4}$ may be varied at will for imposing different limit values on the other phase or polarity of the output voltage $\bar{E}_o$.

In the circuit arrangement of Figure 1, the transistors are of the N–P–N type. It will be recognized, however, that the P–N–P type may be substituted directly for them, and the only effect will be a reversal of phase or polarity of the output voltage $\bar{E}_o$. When $\bar{E}_{c1}$ and $\bar{E}_{c2}$ equal $\bar{E}_{c3}$ and $\bar{E}_{c4}$ it will likewise become evident that the circuit arrangement is electrically symmetrical in the sense that the output terminals and input terminals may be interchanged without altering the capability of the circuit to perform its intended functions. Furthermore, it is to be noted that while in the circuit arrangement illustrated the transistor control elements are the base and collector, the transistor emitter-collector connections in each case may be reversed so that the control elements become the base and emitter, and that the circuit will not be functionally altered by such change.

The first and second transistors TR–1 and TR–2 have controlled discharge paths formed by their respective emitters and collectors and these are serially connected with relatively opposite polarity across the input conductors 14 and 16. The corresponding controlled discharge paths of transistors TR–3 and TR–4 are similarly connected across these two conductors. The junction between transistors TR–1 and TR–2 is connected to output conductor 18, and that between transistors TR–3 and TR–4 is connected to output conductor 20. The wipers of potentiometers 24, 26, 28 and 30 are respectively connected to the bases of transistors TR–1, TR–2, TR–3 and TR–4, whereas the secondary mid-tap or common between potentiometers 24 and 26 is connected to output conductor 18 and that between potentiometers 28 and 30 is connected to output conductor 20. Thus control voltages $\bar{E}_{c1}$, $\bar{E}_{c2}$, $\bar{E}_{c3}$ and $\bar{E}_{c4}$ are impressed on the respective control paths (base-collector) of transistors TR–1, TR–2, TR–3 and TR–4. The potentiometer wipers are shown all mechanically linked together to cause like variations in all of the control voltages simultaneously. It is obvious, however, that this mechanical interconnection may be omitted if independent adjustment of the control voltages or control voltage pairs is preferable. Current-limiting resistances R interposed directly in the respective transistor base external connections prevent over-loading and damage of the transistors as a result of current flow therein. The size of these resistances, indeed the very necessity or lack of need therefor, will depend of course upon the circuit voltages developed in particular applications of the circuit. These resistances are chosen to give the required switching current $\bar{I}_b$ with the desired switching voltage $\bar{E}_c$, which in turn is determined by the incoming signal amplitudes or magnitudes being handled by the circuit. In general, if the control voltages may be small then the resistance R may be small, and in the extreme may even be omitted.

Figures 2A, 2B, 2C and 2D illustrate operation of the circuit as a demodulator-limiter. In Figure 2A the equivalent circuit is shown during one half-cycle of the switching voltages $\bar{E}_{c1}$ and $\bar{E}_{c3}$ for a given relative phase of the carrier frequency embodied in input voltage $\bar{E}_1$. The emitter-collector paths of transistors TR–1 and TR–3 form a series low-impedance path through load $R_L$ between input conductors 14 and 16. During this same half cycle the bases of transistors TR–2 and TR–4 are negative with respect to their collectors and present a high impedance to signal current flow through their emitter collector paths. On the next half-cycle the transistors TR–2 and TR–4 provide the series path through load $R_L$ permitting rectification of current in the same direction through the load as before. Thus demodulation by the circuit is performed with full-wave rectification of the incoming modulated carrier signals. The demodulation efficiency is represented by the gain equation, as follows:

$$\frac{\bar{E}_0}{\bar{E}_i}=\frac{R_L}{R_L+2(r_e+r_c)}$$

where $r_e$ and $r_c$ are the emitter and collector resistances of each transistor. Preferably the control or switching voltages $\bar{E}_{c1}$, $\bar{E}_{c2}$, $\bar{E}_{c3}$ and $\bar{E}_{c4}$ are made sufficiently high in amplitude that the emitter-collector resistances are reduced to inappreciable values relative to the load and source resistances combined, and in that manner a very high conversion efficiency is achieved. That is, for high demodulation efficiency, the actual control current $\bar{I}_b$ which flows in the base-collector paths in the quiescent condition of the circuit should be chosen such that the difference between this curent and the maximum load current is sufficient to keep the collector resistance small relative to the resistance of the source 10 and load $R_L$. In effect the transistors function as alternately open and closed switches during succeeding half cycles of the carrier current to provide efficient full-wave rectification or demodulation of the incoming input signals.

The rises and falls of modulated signal amplitude are reflected directly in corresponding magnitude changes of the rectified output voltage until the point of limit is reached, whereupon further increase of signal amplitude has no appreciable effect on the magnitude of the output pulses. The limiting action of the circuit as a demodulator on successive half cycles of the input carrier is illustrated by the equivalent circuit diagrams in Figures 2C and 2D.

In Figure 2C, transistor TR–2 presents a relatively high impedance to current flow through its controlled discharge (collector-emitter) path before the input signals reach the limiting value of the circuit, that is while the transistor base is maintained negative with respect to both its emitter and collector. During this pre-limit stage of operation during the half-cycle in question control voltage $\bar{E}_{c2}$ exceeds the sum of $\bar{E}_0$ and the voltage drop across the collector-emitter path of transistor TR–3 and is of such a phase that the described negative bias of the base of TR–2 is maintained. However, as the sum of $\bar{E}_0$ and the drop across TR–3 exceeds the switching voltage $\bar{E}_{c2}$, a current $\bar{I}_{b1}$ starts flowing through the base and emitter of TR–2. This relatively small and increasing current causes a progressive decrease in the emitter and collector resistance of TR–2, with the result that instead of these further increases in rectified current passing through the load $R_L$ they pass through the shunt transistor TR–2. This transistor is therefore automatically so controlled that the output voltage $\bar{E}_0$ is prevented from materially exceeding the limiting value established by control voltage $\bar{E}_{c2}$. Of course, limiting does not take place if $\bar{E}_{c2}$ is not of lesser amplitude than the incoming modulated signal. During the succeeding half cycle of the operation in the limit condition for the same phase of the incoming carrier relative to the control voltage, $\bar{E}_{c1}$ determines the output limit level and transistor TR–1 becomes the controlled shunt. Should the phase of the carrier signal be reversed, producing rectified output of opposite polarity, control voltage $\bar{E}_{c3}$ and $\bar{E}_{c4}$ will establish the limit level of the output voltage. It will therefore be seen that $\bar{E}_{c1}$ and $\bar{E}_{c2}$ may if desired be given a different amplitude than $\bar{E}_{c3}$ and $\bar{E}_{c4}$ by potentiometer adjustment in order to make the circuit limit at one value for one rectified output polarity and at a different value for the opposite rectified output polarity. Normally and preferably these values will be made the same.

The same four equivalent circuits as those described above may be used directly to analyze the circuit operation for modulation purposes. During the limiting action of the circuit as a modulator it will be appreciated that the phase of the modulated carrier represented by $\bar{E}_0$ will determine whether $\bar{E}_1$ and $\bar{E}_2$ establish the limit level, or whether it is $\bar{E}_3$ and $\bar{E}_4$ that do so. Variable and non-symmetrical limiting action of the circuit is obtainable when it is used as a modulator as well as a demodulator providing, in the use of a modulator conductors 18 and 20 are used for the input and conductors 14 and 16 for the output. Moreover, the desired conversion efficiency of the circuit may be made relatively high in either case.

In order to obtain a positive or "hard" limit the signal currents and control currents through the transistors must be cophased and of the same waveshape. For demodulation a sine wave input carrier requires a sine wave applied to control terminals 12, whereas for a modulator a steady-state D. C. input requires a square wave switching or control voltage, for producing a hard limit.

With the pairs of transistors placed back-to-back as shown zero drift is substantially negligible. Obviously the number and size of the required components are a minimum and the connections are simple. Since delicate or moving parts are not required the operation is reliable and the useful life of the circuit substantially indefinite; moreover energy consumption is very small. Further the input signal source may be single ended, hence the circuit is directly connectable to most conventional sources of signals to be modulated or demodulated. The limited modulated output waves are not simply clipped and their wave shape thus destroyed, but are maintained substantially in their original form though limited in value at the selected level. The same is true with respect to the rectified modulated carrier waves on demodulation by the circuit. The output signals linearly follow the input signals with respect to amplitude changes short of exceeding the limits, and the established limits are proportional to the limit-producing control voltages.

These and other advantages and aspects of the invention will be evident from the foregoing disclosure of the presently preferred form thereof.

I claim as my invention:

1. Translation circuit apparatus comprising, in combination, a pair of input conductors subject to application of input signals thereto, a pair of output conductors for supplying output voltage to a load connected thereto, first, second, third and fourth transistor devices having emitter and collector elements forming a controlled discharge path through each such device, the controlled discharge paths of the first and second transistor devices being serially connected with relatively opposite polarity across said input conductors, and the controlled discharge paths of the third and fourth transistor devices being similarly connected across said input conductors, said output conductors being respectively connected to the junctions between the first and second transistor devices and between the third and fourth transistor devices, each of said transistor devices having a base element forming with one of the other elements thereof a control path through the device, increase or decrease of current through such control path producing an increase or decrease of conductivity of the controlled discharge path thereof, a first pair of control voltage sources providing alternating control voltages of similar form and amplitude, a second pair of control voltage sources providing alternating control voltages of similar form and amplitude, means connecting the first pair of control voltage sources respectively to the control paths of the first and second transistor devices with relatively opposite polarity, and means similarly connecting the second pair of control voltage sources respectively to the control paths of the third and fourth transistor devices.

2. Translation circuit apparatus comprising, in combination, a pair of input conductors subject to application of input signals thereto, a pair of output conductors for supplying output voltage to a load connected thereto, first, second, third and fourth transistor devices having emitter and collector elements forming a controlled discharge path through each such device, the controlled discharge paths of the first and second transistor devices being serially connected with relatively opposite polarity across said input conductors, and the controlled discharge paths of the third and fourth transistor devices being similarly connected across said input conductors, said output conductors being respectively connected to the junctions between the first and second transistor devices and between the third and fourth transistor devices, each of said transistor devices having a base element forming with one of the other elements thereof a control path through the device, increase or decrease of current through such control path producing an increase or decrease of conductivity of the controlled discharge path thereof, a first pair of control voltage sources providing alternating control voltages of similar form and amplitude, a second pair of control voltage sources providing alternating control voltages of similar form and amplitude equal to that of the first pair, means connecting the first pair of control voltage sources respectively to the control paths of the first and second transistor devices with relative opposite polarity, and means similarly connecting the second pair of control voltage sources respectively to the control paths of the third and fourth transistor devices.

3. Translation circuit apparatus comprising, in combination, a pair of input conductors subject to application of input signals thereto, a pair of output conductors for supplying output voltage to a load connected thereto, first, second, third and fourth transistor devices having emitter and collector elements forming a controlled discharge path through each such device, the controlled discharge paths of the first and second transistor devices being serially connected with relatively opposite polarity across said input conductors, and the controlled discharge paths of the third and fourth transistor devices being similarly connected across said input conductors, said output conductors being respectively connected to the junctions between the first and second transistor devices and between the third and fourth transistor devices, each of said transistor devices having a base element forming with one of the other elements thereof a control path through the device, increase or decrease of current through such control path producing an increase or decrease of conductivity of the controlled discharge path thereof, and means passing bias currents through the control paths of the respective transistor devices, such bias currents in the first and third transistor device control paths being of like phase and those in the second and fourth transistor device control paths being of like phase opposite to such currents in the first and third transistor device control paths.

4. Translation circuit apparatus comprising, in combination, a pair of input conductors subject to application of input signals thereto, a pair of output conductors for applying output voltage to a load connected thereto, first, second, third and fourth transistor devices having emitter and collector elements forming a controlled discharge path through each such device, the controlled discharge paths of the first and second transistor devices being serially connected with relatively opposite polarity across said input conductors, and the controlled discharge paths of the third and fourth transistor devices being similarly connected across said input conductors, said output conductors being respectively connected to the junctions between the first and second transistor devices and between the third and fourth transistor devices, each of said transistor devices having a base element forming with one of the other elements thereof a control path through the device, increase or decrease of current through such control path producing an increase or decrease of conductivity of the controlled discharge path thereof, a first pair of control voltage sources providing alternating control voltages of similar form and amplitude, a second pair of control voltage sources providing alternating control voltages of similar form and amplitude, means connecting the first pair of control voltage sources respectively to the control paths of the first and second transistor devices with relatively opposite polarity, means similarly connecting the second pair of control voltage sources respectively to the control paths of the third and fourth transistor devices, and similar resistance elements interposed directly in the connection between each transistor device base element and the control voltage source connected thereto, said resistance elements having a resistance value limiting the currents in the control paths of the respective transistor devices at values not harmful to such devices.

5. Translation circuit apparatus comprising, in combination, a pair of input conductors subject to application of input signals thereto, a pair of output conductors for supplying output voltage to a load connected thereto, first, second, third and fourth transistor devices having emitter and collector elements forming a controlled discharge path through each such device, the controlled discharge paths of the first and second transistor devices being serially connected with relatively opposite polarity across said input conductors, and the controlled discharge paths of the third and fourth transistor devices being similarly connected across said input conductors, said output conductors being respectively connected to the junctions between the first and second transistor devices and between the third and fourth transistor devices, each of said transistor devices having a base element forming with one of the other elements thereof a control path through the device, increase or decrease of current through such control path producing an increase or decrease of conductivity of the controlled discharge path thereof, a first pair of control voltage sources providing alternating control voltages of similar form and amplitude, a second pair of control voltage sources providing alternating control voltages of similar form and amplitude, means connecting the first pair of control voltage sources respectively to the control paths of the first and second transistor devices with relatively opposite polarity, and means similarly connecting the second pair of control voltage sources respectively to the control paths of the third and fourth transistor devices, said alternating control voltages having equal amplitudes not greater than the amplitudes or magnitudes of the input signals, whereby such pair of control voltages limit the amplitude or magnitude of the output voltage.

6. Translation circuit apparatus comprising, in combination, a pair of input conductors subject to application of input signals thereto, a pair of output conductors for supplying output voltage to a load connected thereto, first, seccond, third and fourth transistor devices having emitter and collector elements forming a controlled discharge path through each such device, the controlled discharge paths of the first and second transistor devices being serially connected with relatively opposite polarity across said input conductors, and the controlled discharge paths of the third and fourth transistor devices being similarly connected across said input conductors, said output conductors being respectively connected to the junctions between the first and second transistor devices and between the third and fourth transistor devices, each of said transistor devices having a base element forming with one of the other elements thereof a control path through the device, increase or decrease of current through such control path producing an increase or decrease of conductivity of the controlled discharge path thereof, a first pair of control voltage sources providing alternating control voltages of similar form and amplitude, a second pair of control voltage sources providing alternating control voltages of similar form and amplitude, means connecting the first pair of control voltage sources respectively to the control paths of the first and second transistor devices with relatively opposite polarity, means similarly connecting the second pair of control voltage sources respectively to the control paths of the third and fourth transistor devices, and means for varying the amplitudes of at least one pair of control voltages of different values less than the ampltude or magnitude of the input signals for varying the limit level of the output voltage.

7. Translation circuit apparatus comprising, in combination, a pair of input conductors subject to application of input signals thereto, a pair of output conductors for supplying output voltage to a load connected thereto, first, second, third and fourth transistor devices having emitter and collector elements forming a controlled discharge path through each such device, the controlled discharge paths of the first and second transistor devices being serially connected with relatively opposite polarity across said input conductors, and the controlled discharge paths of the third and fourth transistor devices being similarly connected across said input conductors, said output conductors being respectively connected to the junctions between the first and second transistor devices and between the third and fourth transistor devices, each of said transistor devices having a base element forming with one of the other elements thereof a control path through the device, increase or decrease of current through such control path producing an increase or decrease of conductivity of the controlled discharge path thereof, a first pair of control voltage sources providing alternating control voltages of similar form and amplitude, a second pair of control voltage sources providing alternating control voltages of similar form and amplitude, means connecting the first pair of control voltage sources respectively to the control paths of the first and second transistor devices with relatively opposite polarity, means similarly connecting the second pair of control voltage sources respectively to the control paths of the third and fourth transistor devices, and means for varying the amplitudes of the control voltages to different equal values less than the amplitude or magnitude of the input signals for varying the limit level of output voltage of either polarity or phase.

No references cited.